US012669544B2

(12) United States Patent
Kunduru et al.

(10) Patent No.: US 12,669,544 B2
(45) Date of Patent: Jun. 30, 2026

(54) MULTIPLE PRIMARY NODES FOR WIRELESS BATTERY MANAGEMENT SYSTEM ROBUSTNESS

(71) Applicant: TEXAS INSTRUMENTS INCORPORATED, Dallas, TX (US)

(72) Inventors: Jyothsna Kunduru, Plano, TX (US);
Ariton Xhafa, Plano, TX (US);
Minghua Fu, Plano, TX (US);
Jonathan Nafziger, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 844 days.

(21) Appl. No.: 17/823,138

(22) Filed: Aug. 30, 2022

(65) Prior Publication Data

US 2024/0069110 A1      Feb. 29, 2024

(51) Int. Cl.
*G01R 31/371*          (2019.01)
*G01R 31/396*          (2019.01)
(Continued)

(52) U.S. Cl.
CPC ......... *G01R 31/371* (2019.01); *G01R 31/396* (2019.01); *H01M 10/4257* (2013.01);
(Continued)

(58) Field of Classification Search
CPC ............... G01R 31/371; G01R 31/396; H01M 10/4257; H01M 2010/4271; H01M 2010/4278
(Continued)

(56) References Cited

U.S. PATENT DOCUMENTS 9,293,935  B2 *   3/2016  Lee ........................... H04Q 9/00
11,038,216  B2    6/2021  Kwon
(Continued)

FOREIGN PATENT DOCUMENTS

CN        109324501      *   2/2019
CN        109324501  A      2/2019
CN        114156547  A      3/2022

OTHER PUBLICATIONS

International Standard, ISO 26262-1, "Road vehicles—Functional Safety", International Organization for Standardization, Second Addition, Dec. 2018, 42 pgs.
(Continued)

*Primary Examiner* — Nathaniel R Pelton
(74) *Attorney, Agent, or Firm* — Carl G. Peterson; Frank D. Cimino

(57) ABSTRACT

A system includes a first plurality of secondary devices, each secondary device of the first plurality of secondary devices including a first wireless transmitter and a battery monitor integrated circuit (IC). The battery monitor IC is configured to obtain battery data from at least one battery cell, and the first wireless transmitter is configured to wirelessly transmit the battery data. A first primary device has a second wireless transmitter wirelessly coupled to the first wireless transmitters of the first plurality of secondary devices via a first wireless network. A second primary device has a second wireless transmitter. The second primary device is configured to detect a fault with the first primary device and, in response detection of the fault, to establish a second wireless network with the first plurality of secondary devices.

20 Claims, 8 Drawing Sheets

(51) Int. Cl.
    *H01M 10/42*       (2006.01)
    *H04W 72/21*       (2023.01)
(52) U.S. Cl.
    CPC .... *H04W 72/21* (2023.01); *H01M 2010/4271* (2013.01); *H01M 2010/4278* (2013.01)
(58) Field of Classification Search
    USPC ........................................................ 320/107
    See application file for complete search history.

(56) References Cited

U.S. PATENT DOCUMENTS

| | | | |
|---|---|---|---|
| 11,483,824 B2 | 10/2022 | Lee | |
| 2009/0206841 A1* | 8/2009 | Weng | G01R 31/396 |
| | | | 307/64 |
| 2016/0218866 A1 | 7/2016 | Patil et al. | |
| 2019/0273293 A1 | 9/2019 | Kim et al. | |
| 2020/0396688 A1 | 12/2020 | Hong | |
| 2021/0043983 A1 | 2/2021 | Choi | |
| 2021/0084675 A1 | 3/2021 | Aijaz | |
| 2022/0091062 A1 | 3/2022 | Gullapalli | |
| 2022/0113356 A1 | 4/2022 | Kasselman | |
| 2022/0179001 A1 | 6/2022 | Park | |
| 2022/0332213 A1 | 10/2022 | Xhafa et al. | |

OTHER PUBLICATIONS

Xhafa, et al., "Wireless Protocol for Battery Management Systems", Texas Instruments, Jun. 4, 2019, 6 pgs.
Xhafa, et al., U.S. Appl. No. 17/820,441, "Mesh Network During Keep Alive in Wireless Battery Management System", filed Aug. 17, 2022.
Kunduru, et al., U.S. Appl. No. 17/823,138, "Multiple Primary Nodes for Wireless Battery Management System Robustness", filed Aug. 30, 2022.
Texas Instruments. CC2642R SimpleLink(TM) Bluetooth(R) 5.2 Low Energy Wireless MCU. SWRS194H—Jan. 2018—Revised Mar. 2021. 66 pages.
Xhafa, et al., "Enabling Data Integrity in Wireless Devices Connected to Battery Monitor", Texas Instruments, Jun. 4, 2019, 4 pgs.
EM Microelectronic, EM9301 Datasheet, 2018, 51 pages (Year: 2018).
Song et al. "The AES-CMAC Algorithm", National Institute of Standards and Technology (NIST), 2006, "https://www.rfc-editor.org/rfc/pdfrfc/rfc4493.txt.pdf", 20 pages (Year: 2006).
Nordic semiconductor, nRF25840 Datasheet, 2018, 551 pages (Year: 2018).
International Search Report and Written Opinion, dated Dec. 20, 2023, Application No. PCT/US2023/031235, 11 pages.

* cited by examiner

300

302                    304                    305

RF TRANSCEIVER          MICROCONTROLLER

MEMORY

S/W                    306

308

MULTIPLE PRIMARY NODES FOR WIRELESS BATTERY MANAGEMENT SYSTEM ROBUSTNESS

BACKGROUND

Increasingly, battery packs are being integrated into systems which traditionally were not powered by batteries, such as cars, houses, and even parts of the electrical grid. In addition to becoming more common, battery packs are becoming larger and more complex. For example, modern battery packs may comprise hundreds or thousands of battery cells. Monitoring the health and status of the individual cells in such battery packs helps to ensure continued proper operation of the system powered by such battery packs.

SUMMARY

A system includes a first plurality of secondary devices, each secondary device of the first plurality of secondary devices including a first wireless transmitter and a battery monitor integrated circuit (IC). The battery monitor IC is configured to obtain battery data from at least one battery cell, and the first wireless transmitter is configured to wirelessly transmit the battery data. A first primary device has a second wireless transmitter wirelessly coupled to the first wireless transmitters of the first plurality of secondary devices via a first wireless network. A second primary device has a second wireless transmitter. The second primary device is configured to detect a fault with the first primary device and, in response detection of the fault, to establish a second wireless network with the first plurality of secondary devices.

BRIEF DESCRIPTION OF THE DRAWINGS

For a detailed description of various examples, reference will now be made to the accompanying drawings in which.

The same reference numbers or other reference designators are used in the drawings to designate the same or similar (either by function and/or structure) features.

DETAILED DESCRIPTION

Some systems are battery-operated and include large numbers of battery cells. Subsets of the battery cells may be packaged together in battery modules. Groups of interconnected battery modules represent a battery pack. Accordingly, a battery pack may have multiple battery cells, and in some cases may have hundreds or more of battery cells. Electric vehicles (EVs), for example, include rechargeable battery packs to operate the EV's electric motor and power various electronic components within the vehicle. In the context of an EV, the battery pack may provide a voltage of 400V, 800V or another voltage. Monitoring the individual battery cells for information such as such as voltage, current, temperature, register settings, etc., helps ensure the health and functionality of the overall battery pack. For example, battery cells may vary in terms of capacity and the rate of discharge (and/or charge). The cell-to-cell variation may result in imbalances in the state of charge between battery cells. Balancing techniques (e.g., passive cell balancing, active cell balancing) are available to more evenly balance the load (and/or power) across the cells and help improve the available capacity of the battery pack and increase its usable life. Passive cell balancing may dissipate excess charge in a given cell through a bleed resistor. Active cell balancing redistributes charge between individual cells during the charge and discharge cycles. As may be useful, a battery management system may be included to monitor and adjust the battery pack (e.g., cell balancing) of the system.

Figure 1:
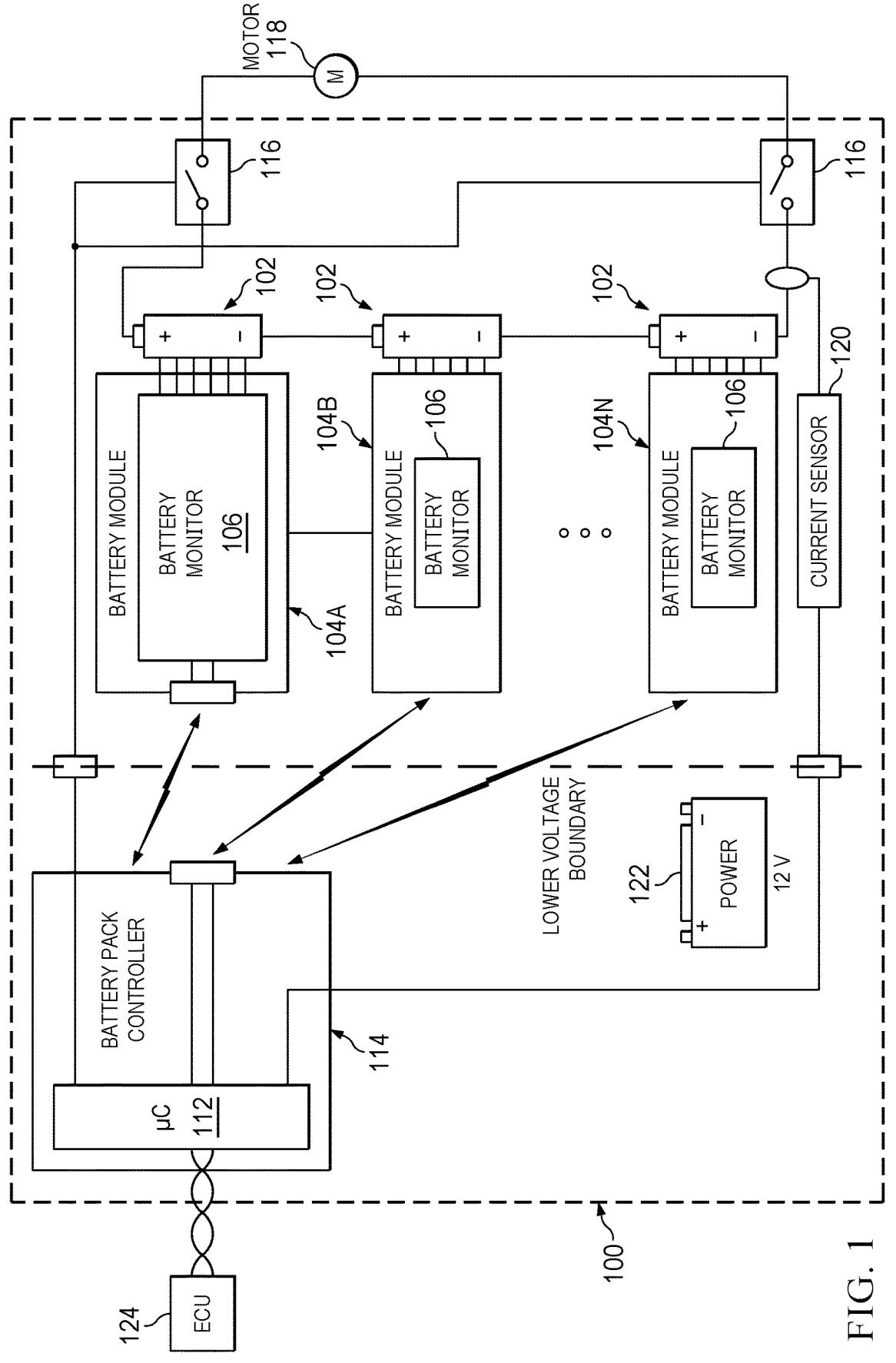
FIG. 1 is a block diagram illustrating a battery management system (WBMS) having primary and secondary nodes, in accordance with an example.

FIG. 1 is a block diagram illustrating a wireless battery management system (WBMS) 100, in accordance with aspects of the present disclosure. WBMS 100 is operative for providing power to a system such as an EV. In addition to the WBMS 100, the system includes a motor 118 (e.g., the electric motor to cause the EV to move) and an electric control unit (ECU) 124. The WBMS 100 includes battery modules 104A, 1043, . . . , 104N (collectively, battery modules 104) and a battery pack controller 114. The battery pack controller 114 is in wireless communication with each of the battery monitors 104. Each battery monitor 104 monitors and controls a respective set of battery cells 102. Each instance of battery cells 102 includes one or more cells (6 cells, 9 cells, 18 cells, etc.), and the connected groups of battery cells 102 represent the battery pack for the system (e.g., EV). Each set of battery cells 102 is coupled to a battery module 104. In other embodiments, the battery cells 102 are included within, and are part of, the battery module 104. The number N of battery modules 104 depends on the number of individual battery cells 102 that each module is capable of monitoring. The sets of battery cells may be coupled in series to produce a substantially high voltage (e.g., 400V, 800V, etc.). The battery pack controller 114 includes an interface (e.g., a controller area network (CAN) bus) to the ECU 124.

Each battery module 104 includes a battery monitor 106. Each battery monitor 106 may include an analog front-end coupled to the corresponding battery cells 102 to measure and collect information (e.g., voltage, current, charge status, temperature, etc.) about the battery cells 102. In this example, each battery monitor 106 is wirelessly coupled to the battery pack controller 114. A microcontroller 112 within the battery pack controller 114 may process and may provide the battery cell information of some or all of the cells 102 to the ECU 124.

Each battery monitor 106 collects and digitizes the information about its respective battery cells 102 and wirelessly transmits the digital information to the battery pack controller 114 for reception by the microcontroller 112. The microcontroller 114 may also be coupled to control inputs of switches 116 that couple the battery cells 102 to one or more motors 118 or other load devices. The microcontroller 112 may also be coupled to one or more other sensors, such as a current sensor 120, which may monitor the current being supplied by the battery pack to the motor 118. In this example, the battery pack controller 114 is powered by a battery 122 that is separate from the battery cells 102. Battery 122 may be, for example, a relatively low voltage battery, such as a 12V battery, while the voltage produced by the serially-connected sets of battery cells 102 may be a higher voltage (e.g., 400V, 800V, etc.).

The battery monitors 104 wirelessly transmit their battery data to the battery pack controller 114. The battery pack controller 114 and/or the ECU 124 may monitor the state of the individual cells and perform various actions as desired. For example, the ECU 124 may detect that the voltage of certain cells 102 are different from each other, and respond by performing a cell balancing procedure such as a passive or active cell balancing process. If the battery pack controller 114 were to malfunction or otherwise be unable to receive battery data from the battery monitors 104, the ability to monitor the battery cells of the battery pack and respond to the state of the cells as appropriate may be unavailable.

Figure 2:
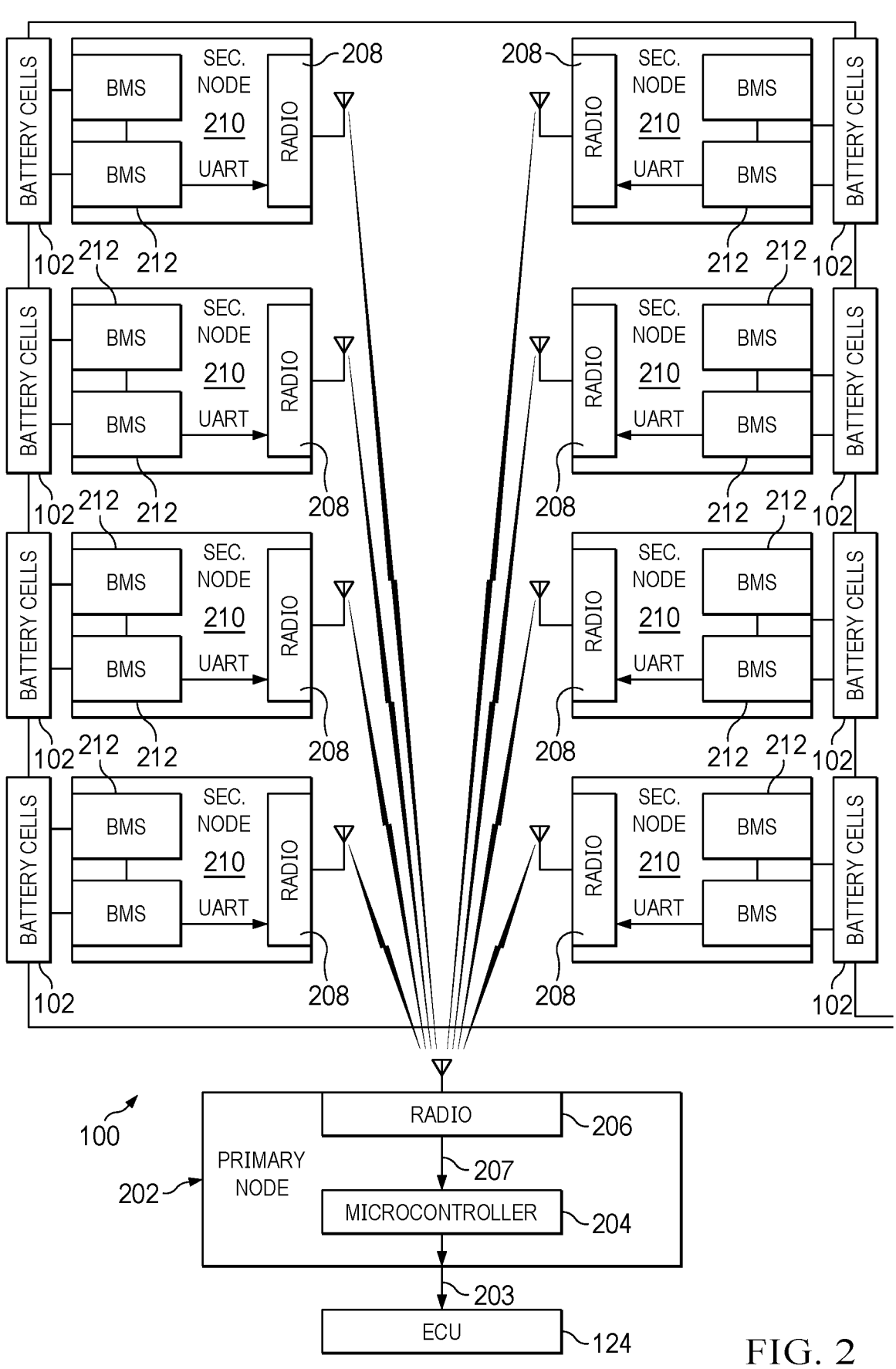
FIG. 2 is another block diagram illustrating a WBMS, in accordance with an example.

The embodiments described herein are directed to the inclusion and use of a backup battery pack controller. As a result of a failure of the currently operating battery pack controller 114, a failover process may be performed by which the backup battery pack controller takes over the functionality of the now-failed battery pack controller, FIG. 2 is a block diagram illustrating an embodiment of WBMS 100, in accordance with aspects of the present disclosure. The WBMS 100 includes a primary node 202 that functions in a way similar to the battery pack controller 114. The primary node 202 includes a microcontroller 204 which is coupled to ECU 124, via, for example, a CAN bus 203. The microcontroller 204 may operate in a substantially similar way as microcontroller 112. The microcontroller 204 is coupled to a radio 206 via a digital communication interface 207 such as a universal asynchronous receiver-transmitter (UART) interface, serial peripheral interface (SPI), shared memory, etc. The radio 206 is wirelessly coupled to the secondary nodes 210. The secondary nodes 210 represent the battery modules 104 of FIG. 1. Each secondary node 210 include a radio 208 for communicating with the primary node's radio 206. Each secondary node 210 also includes one or more battery monitoring systems (BMS) 212, which are coupled to the respective radio 208 via a UART or other type of electrical interface. Although two BMS's 212 are shown in each battery module 210 in FIG. 2, any suitable number of BMS's may be included in any given battery module (e.g., one or more). The radios 206 and 208 are capable of radio frequency (RF) wireless transmissions. Each secondary node 210 may be fabricated as a printed circuit board (PCB) on which the BMS's 212 and the radio 208 are mounted. In this configuration, each BMS 212 is fabricated as an integrated circuit (IC), and each radio 208 also is fabricated as an IC.

The BMS's 212 may be similar to battery monitors 106 and may include analog front-ends coupled to the battery cells 204 to measure and collect information (e.g., voltage, current, etc.) about the battery cells. This information may be sent, via the digital communication interface, to the respective radio 208 of the secondary node 210. The radio 208 of each secondary node 210 then wirelessly transmits the information to the primary node 202. In some cases, this wireless transmission may be performed according to a wireless battery management protocol, such as a WBMS protocol.

The wireless battery management protocol may define a set of wireless channels along with a set of rules for how information may be wirelessly transmitted for monitoring and managing the battery cells 102. In some cases, the wireless battery management protocol may utilize unlicensed frequency bands such as the 2.4 GHz, 5.8 GHz, etc, bands. Generally, a frequency band, such as the 2.4 GHz unlicensed frequency band, can be divided into a set of channels where each channel includes a set of frequency resources within a certain set of frequencies. The number of channels and the size of the channels may be determined based on the protocol. For example, the WBMS protocol may divide the 2.4 GHz unlicensed frequency band into a set of 40 channels where each channel is 2 MHz wide. As another example, IEEE 802.11 wireless networks may divide the same 2.4 GHz unlicensed frequency band into a set of 11 channels where each channel is 20 MHz wide.

Figure 3:
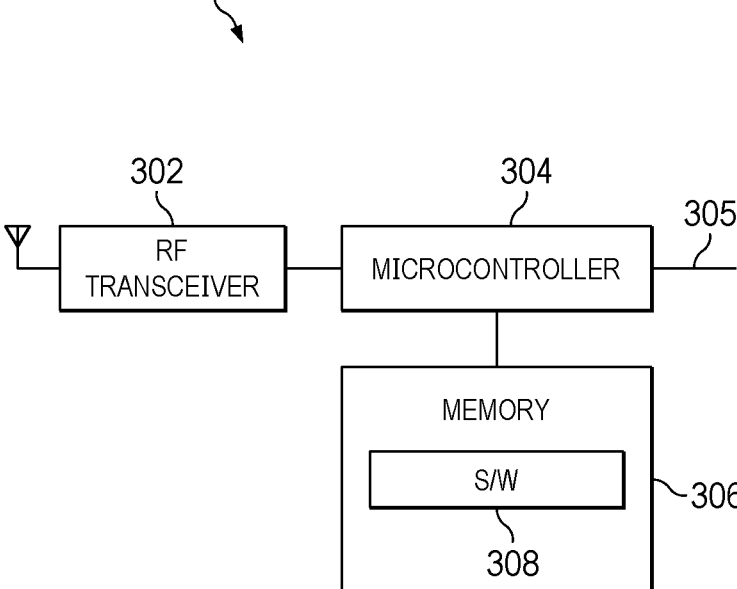
FIG. 3 is a block diagram of a radio usable in the primary and secondary nodes of the WBMS, in accordance with an example.

FIG. 3 is a block diagram of a radio 300, which may be used to implement either or both of radios 206 of the secondary nodes 210 and radio 208 of the primary node 202. In this example, radio 300 includes an RF transceiver 302, a microcontroller 304, and memory 306. Microcontroller 304 is coupled to the RF transceiver 302 and to memory 306. Memory 306 may store software 308 that is executable by microcontroller 304. The creation of the mesh network in the examples described herein may be implemented by the microcontroller 302 of radios 206 and 208 upon executing software 308. The software 308 provided in radios 208 of the secondary nodes 210 may implement different functionality than the software provided in radio 206 of the primary node 202.

Figure 4:
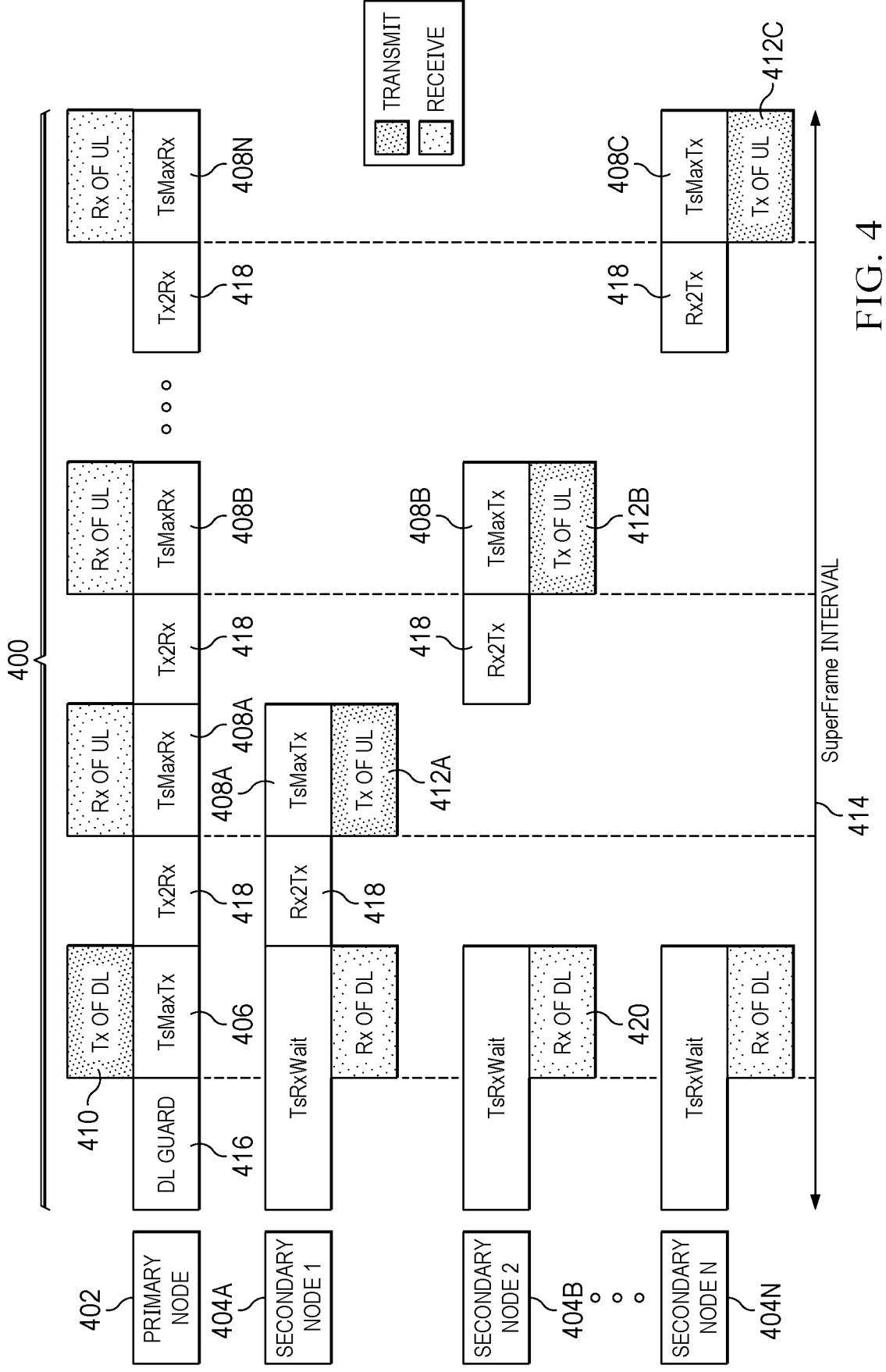
FIG. 4 is a diagram of a superframe for a WBMS, in accordance with an example.

The primary node 202 and the secondary nodes 210 exchange information in accordance with a "superframe." FIG. 4 is a superframe diagram 400 of a WBMS superframe 450 for the case in which the system in which the WBMS is operated is ON, and thus the battery pack controller 114 (primary node 202) are ON and capable of receiving wireless battery data from the battery monitors 106 (secondary nodes 210). The lefthand side of the superframe diagram 400 lists a primary node 402 and multiple secondary nodes 404A, 404B, . . . , 404N (collectively, secondary nodes 404). The primary node 402 may include, or be, the battery pack controller 114 of FIG. 1 or the primary node 202 of FIG. 2. The secondary nodes 404 may include, or be, the battery monitors 106 of FIG. 1 or the secondary nodes 210 of FIG. 2.

Along with channel sizing, the WBMS protocol further defines how communications between nodes may be performed. A WBMS network is directed by the primary node 402 which coordinates communications between the set of N secondary nodes 404. In one example, the primary node 402 coordinates communications for the WBMS network by defining communication intervals and allocating the intervals using the superframe 450 structure illustrated in the example of FIG. 4. The superframe 450 includes a downlink allocation 406 for the primary node 402 and uplink allocations 408A, 408B, . . . , 408N (collectively, uplink allocations 408) for secondary nodes 404A, 404B, . . . , 404N of the set of secondary nodes 404. In this example, the superframe 450 also includes a guard interval 416 prior to the downlink transmission 410, along with switching intervals 418 to provide time for the nodes to switch from a receive mode to a transmit mode, or vice versa. A superframe interval 414 is the amount of time to complete all transmissions for the superframe 450, including the guard interval 416. The time duration of the superframe interval 414 may vary from WBMS network to WBMS network based on the number of secondary nodes 404 in the WBMS network.

The primary node 402 transmits (410), during the downlink allocation 406 to the secondary nodes 404, allocation information about the uplink allocations 408 for the secondary nodes 404. The allocation information may include the set of channels (e.g., as indicated by a bit map) that may be used for the WBMS network along with a per-secondary node uplink allocation indicating when the respective secondary node 404A, 404B, . . . , 404N may transmit 412A, 4123, . . . 412N to the primary node 402. In some cases, the allocation information may include additional information such as an acknowledgement for uplink transmissions from a previous superframe, an indication when the next superframe may begin, an adaptive frequency hopping countdown, etc. In some cases, each secondary node 404 wirelessly coupled to the primary node 402 is provided an individualized uplink avocation 408 to transmit information about the battery cells associated with the respective secondary node 404.

Each secondary node 404 gathers information about its respective battery cells and wirelessly transmits 412 such information to the primary node 402 during the uplink interval 408 assigned to the secondary node. For example, secondary node 2 4043 receives 420 the downlink transmission 410 from the primary node 402 during the downlink allocation 406. In some cases, the secondary nodes 404 may determine the downlink allocation 406 time based on an indication from a previous superframe. The uplink transmissions 412 (and retransmissions, if any) by the secondary nodes 404 are completed within their respective uplink allocations 408, but the uplink transmissions may not occupy the entire uplink allocations 408.

After receiving the downlink transmission 410 from the primary node 403, each secondary node 404 may parse the allocation information received from the primary node 402 to determine timing information for the secondary node's uplink allocation 408 allocated to the secondary node. In some cases, information for how to locate the timing information associated with a specific secondary node may be exchanged during a WBMS network formation process.

Figure 5:
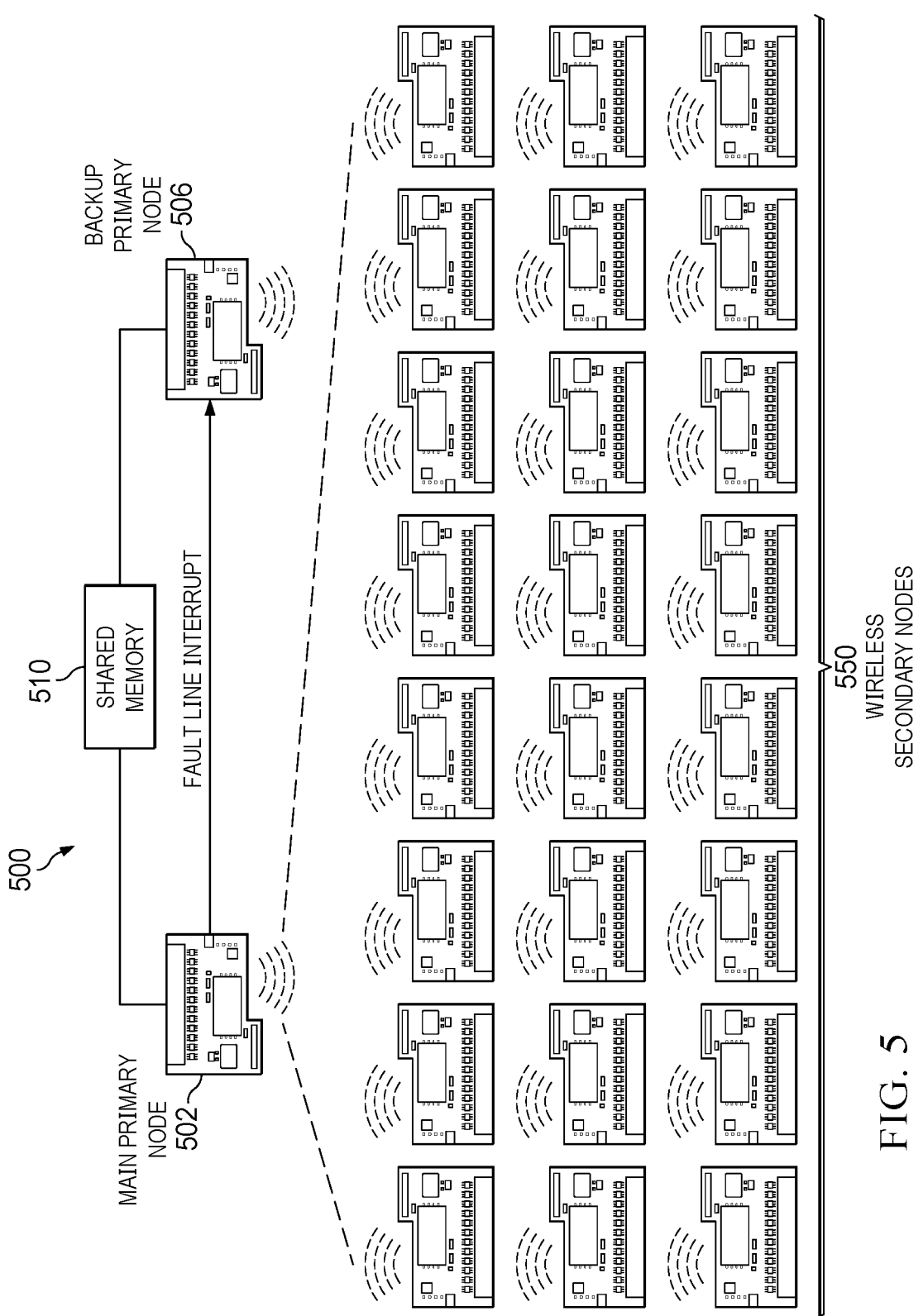
FIG. 5 is a block diagram of a WBMS system having a primary node, a backup primary node, and memory that is shared between the primary and backup primary nodes, in accordance with an example.

FIG. 5 is a block diagram of a WBMS 500 that includes two primary nodes 502 and 506, a shared memory 510, and multiple secondary node 550. In this example, primary node 502 is designated as the "main" primary node and thus functions to exchange information with the secondary nodes 550 in accordance with the superframe structure described above. Primary node 506 may be an instance of the same primary node device of primary node 502, but functions in a backup role to primary node 502 (and thus is referred to as the "backup" primary node). If the main primary node 502 were to fail (e.g., become incapable of sending packets to or receiving packets from the secondary nodes 550, processing packets received from the secondary nodes 550, etc.), the backup primary node 506 can assume the role of the main primary node.

When operational to communicate with the secondary nodes, the main and backup primary nodes 502 and 506 function in a way similar to the battery pack controller 114 described above. Each secondary node 550 may include a battery monitor (e.g., battery monitor 506) and, or be coupled to, one or more battery cells. The shared memory 510 may include volatile storage (e.g., random access memory) or non-volatile storage (e.g., programmable read-only memory).

While the main primary node 502 is actively functioning to exchange packets with the secondary node 550, the main primary node 502 stores network data in the shared memory 510. Such network data may include timing information such as scheduling downlink allocation (e.g., number of downlink slots), uplink allocation (e.g., number of uplink slots), frequency hopping tables, superframe construction, security keys, encryption keys, device identifiers of the devices to form the network, etc.

The main primary node 502 includes fault detection capabilities. For example, main primary node's microcontroller may output a "heartbeat" signal to a fault detection circuit. The fault detection circuit may be configured to expect the heart signal every n milliseconds (e.g., every 1 millisecond). The absence of a timely occurrence of the heartbeat signal may indicate that the microcontroller is in an error state and incapable of functioning as intended. Regardless of the mechanism for detecting a fault with the main primary node 502, the main primary node (e.g., its fault detection circuit) outputs a fault line interrupt signal to the backup primary node 506 to indicate the occurrence of a fault condition with the main primary node 502.

Upon receipt of the asserted fault line interrupt signal, the backup primary node 506 reads the network data from the shared memory 510 and uses the network data to assume the role of the main primary node. To take on the role of the main primary node, the backup primary node reforms and synchronizes the network. For example, the backup primary node may initiate network formation similar to what would happen in a power-on sequence.

Figure 6:
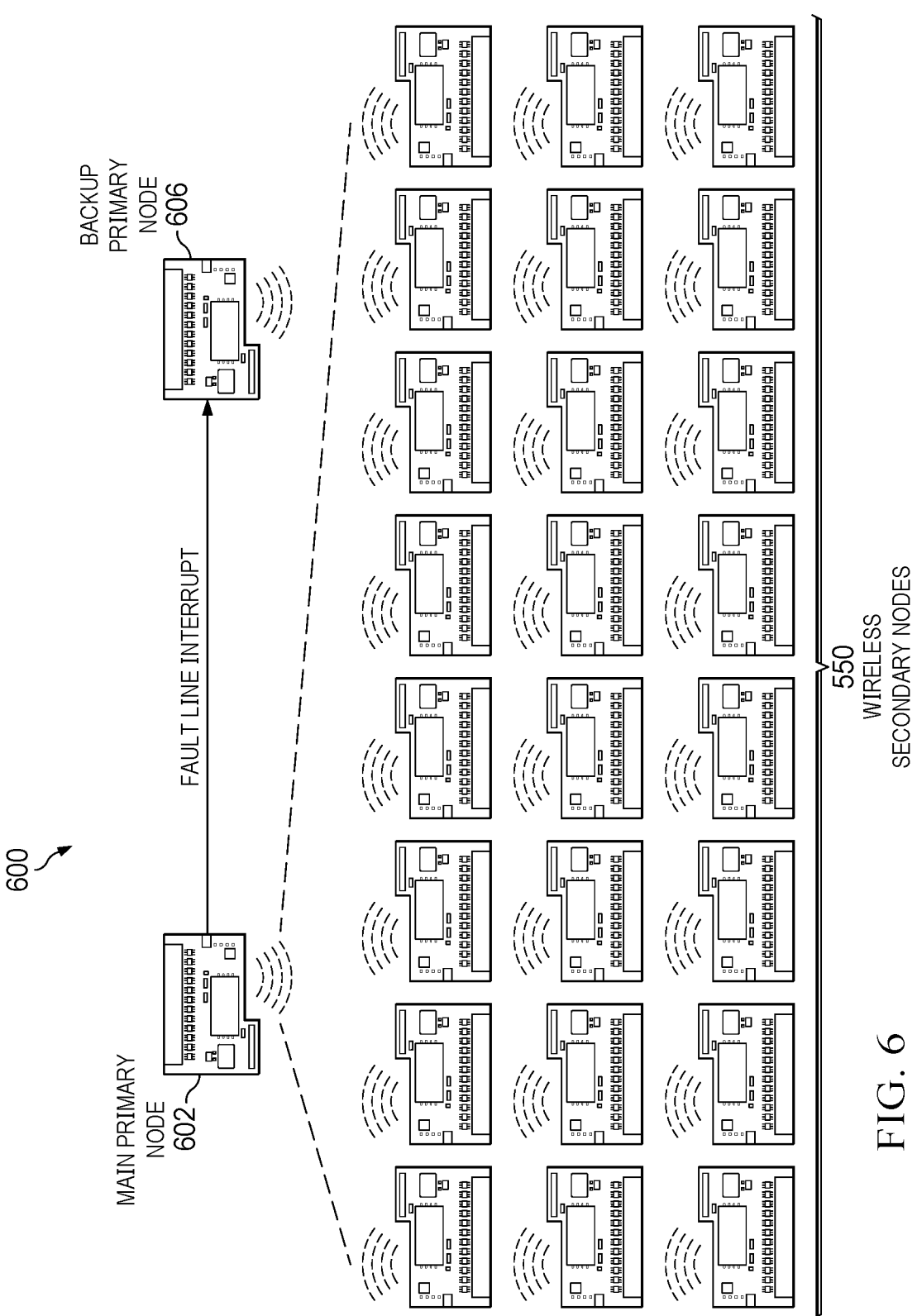
FIG. 6 is a block diagram of a WBMS system having a primary node and a backup primary node without use of a shared memory, in accordance with an example.

FIG. 6 is a block diagram of a WBMS 500 that includes two primary nodes 602 and 606 and multiple secondary node 550. As described above, primary node 602 is designated as the "main" primary node and thus functions to exchange information with the secondary nodes 550 in accordance with the superframe structure described above. Primary node 606 may be an instance of the same primary node device of primary node 602, but functions in a backup role to primary node 602. If the main primary node 602 were to fail (e.g., become incapable of sending packets to or receiving packets from the secondary nodes 550, processing packets received from the secondary nodes 550, etc.), the backup primary node 606 can assume the role of the main primary node. When operational to communicate with the secondary nodes, the main and backup primary nodes 602 and 606 function in a way similar to the battery pack controller 114 described above. This embodiment lacks the shared memory 510 described above.

As described above, the main primary node 602 includes fault detection capabilities (e.g., a fault detection circuit that is configured to expect a heartbeat signal every n milliseconds (e.g., every 1 millisecond) from the main primary node's microprocessor. The absence of a timely occurrence of the heartbeat signal may indicate that the microcontroller is in an error state and incapable of functioning as intended. As described above, the main primary node 602 (e.g., its fault detection circuit) outputs a fault line interrupt signal to the backup primary node 606 to indicate the occurrence of a fault condition with the main primary node 602.

Due to the failure of the main primary node 602, the secondary nodes 550 will cease receiving downlink packets from the main primary node. Each secondary node 550 has timing data previously provided to it by the main primary node 602 by which each such secondary node can determine when to expect a downlink packet from the main primary node. Each secondary node 550 responds to the absence of an expected downlink packet by transitioning to a scan mode in which the secondary node waits for network creation packets from a primary node. Rather than using network data from a shared memory, the backup primary node 606 re-establishes a network with the secondary nodes 550. In one example, the network re-establishment process occurs through any of multiple different methods which may include performing the rejoining operation with encryption key exchange packets to re-authenticate and establish the network.

The backup primary node 606 is now operating as the main primary node. The backup primary node 606 may have the same fault detection capability as the former main primary node 602. The faulty main primary node 602 may repaired or replaced in the WBMS 600 and may again take on the role of the main primary node if, for example, the backup primary node 606 were to subsequently fail.

Figure 7:
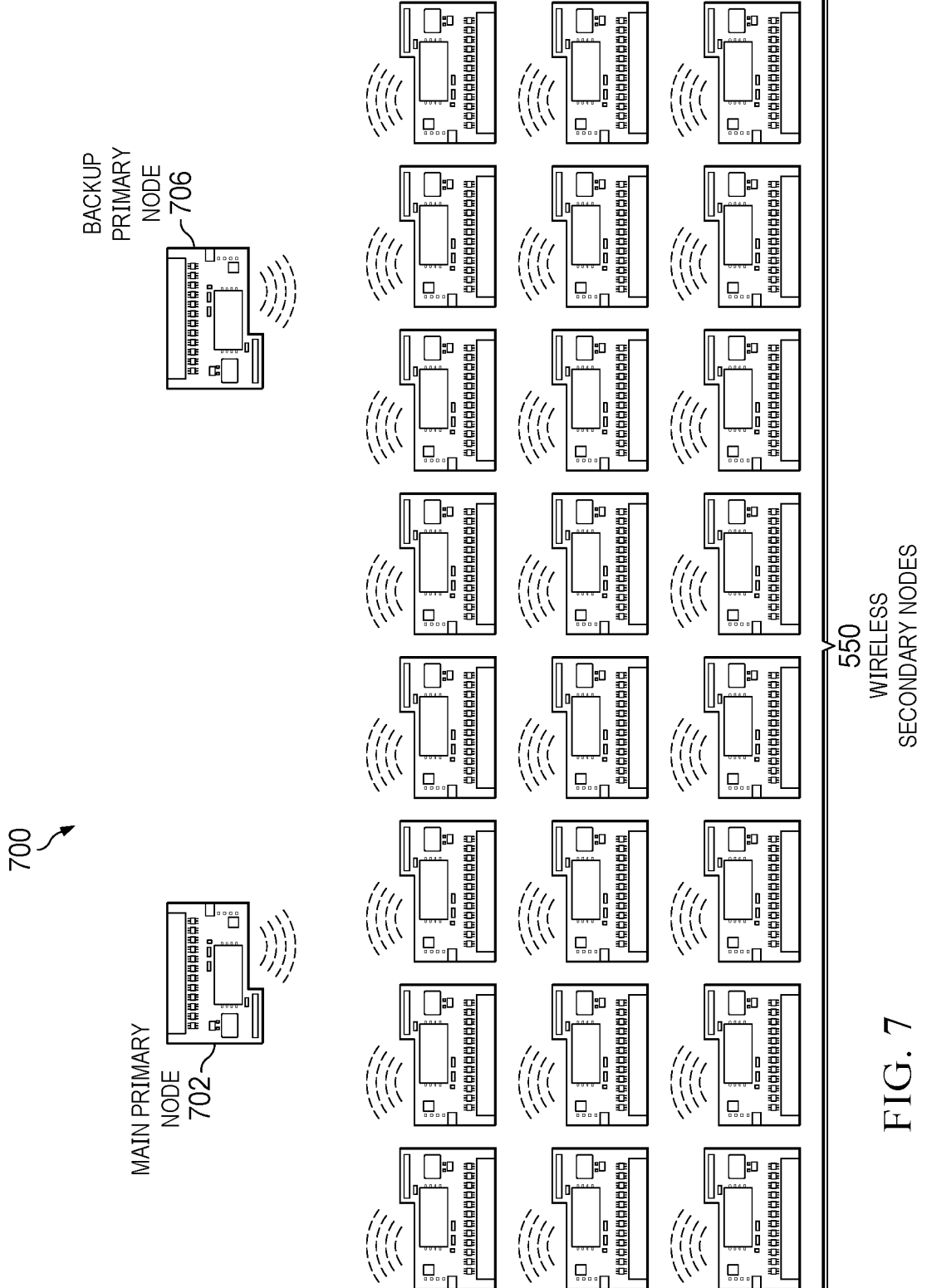
FIG. 7 is a block diagram of a WBMS system having a primary node and a backup primary node, in accordance with yet another example.

FIG. 7 is a block diagram of a WBMS 700 that includes two primary nodes 702 and 706 and multiple secondary node 550. As described above, primary node 702 is designated as the "main" primary node and thus functions to exchange information with the secondary nodes 550 in accordance with the superframe structure described above. Primary node 706 may be an instance of the same primary node device of primary node 702, but functions in a backup role to primary node 702. If the main primary node 702 were to fail (e.g., become incapable of sending packets to or receiving packets from the secondary nodes 550, processing packets received from the secondary nodes 550, etc.), the backup primary node 706 can assume the role of the main primary node. When operational to communicate with the secondary nodes, the main and backup primary nodes 702 and 706 function in a way similar to the battery pack controller 114 described above. This embodiment lacks both the shared memory 510 and the fault line interrupt capability described above.

In this embodiment, the backup primary node independently decides to re-establish a network with the secondary node 550 based on absence of packet transmissions for more than a threshold period of time. For example, the backup primary node 706 can synchronize to the main primary node 702 in the configuration channel phase and continue to follow the main primary node 702 in the connected mode. In this embodiment, the backup primary node is able to observe the network configuration in the configuration channel to determine the timing and sizing of the network. Then, the backup primary node tracks the active network behavior in the connected mode to maintain synchronization to the main primary node over time. After the initial synchronization, the backup primary node 706 may monitor the main primary node 702 at periodic intervals (e.g., once every minute, every 5 minutes, etc.). The length of the periodic interval may be programmable in the backup primary node 706. If the backup primary node 706 is not able to receive packets from the main primary node 702, the backup primary node 706 may determine that the main primary node 702 has failed. In response to the cessation of packets from the main primary node 702, the backup primary node 706 may initiate the process to establish its own network with the secondary node 550. The secondary nodes 550, also not having received packets from the main primary node 702, participate in the network establishment process as described above.

Figure 8:
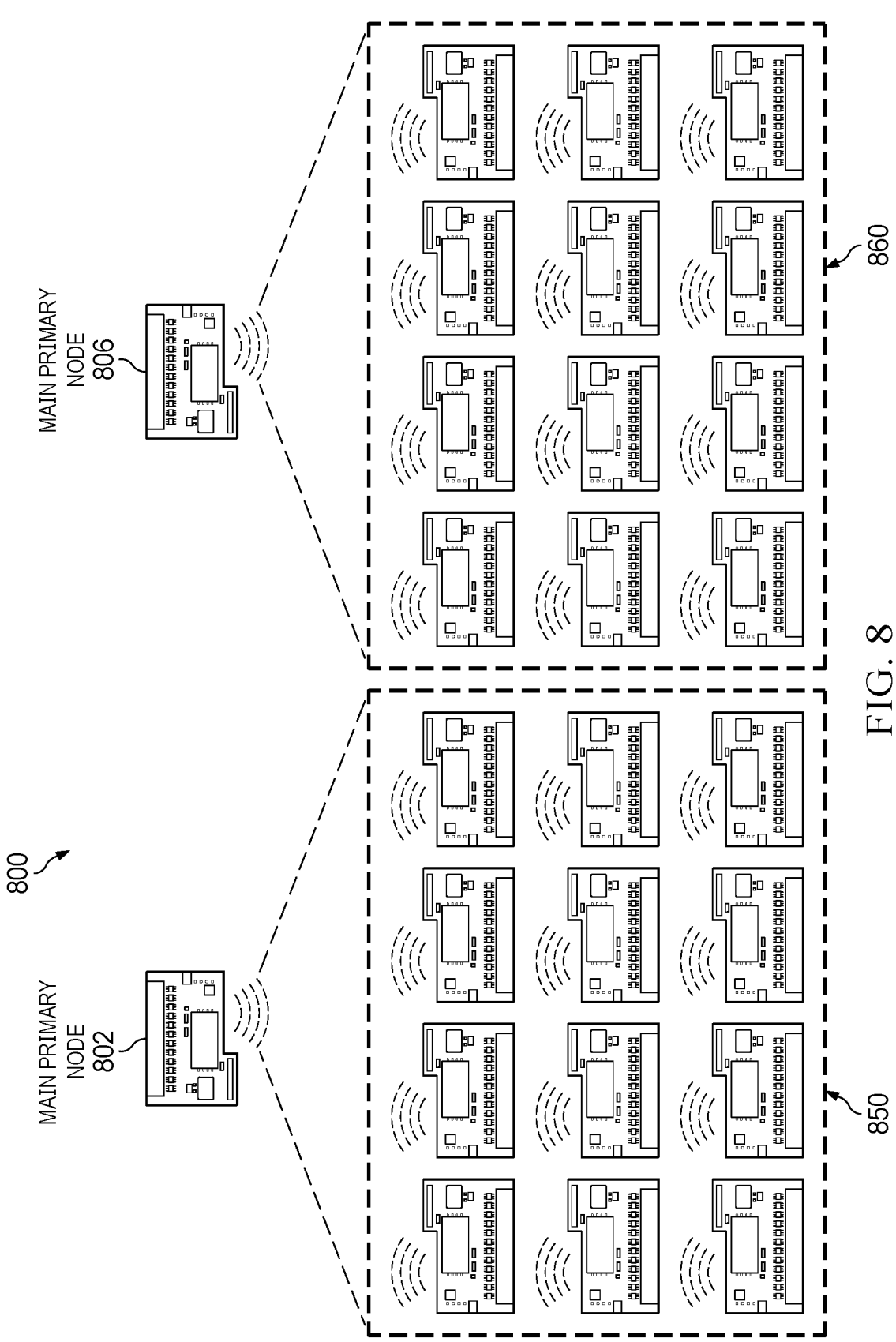
FIG. 8 is a block diagram of a WBMS system having a primary node and a backup primary node, in accordance with another example.

FIG. 8 shows yet another embodiment of a WBMS 800 including two main primary nodes 802 and 806, both of which actively communicate with secondary nodes. In this example, main primary node 802 has established a network with secondary nodes 850, and main primary node 806 has established a network with secondary nodes 860. The two networks operate simultaneously. The main primary nodes and the secondary nodes may be implemented as described above. Each main primary node 802, 806 is programmed with a unique identifier (e.g., an address) of the secondary nodes each such main primary node is to establish its network. Accordingly, main primary node 802 is programmed with the addresses of secondary nodes 850, and main primary node 806 is programmed with the addresses of secondary nodes 860. In addition, each main primary node is programmed with the addresses of the secondary nodes to which the other main primary node has established a network for use in the event of a failure of the other main primary node. That is, each main primary node is programmed with the addresses of its own secondary nodes as well as the secondary nodes within the network of the other main primary node.

Periodically (e.g., once every 5 minutes) each main primary node 802 and 806 scans for packets from the other main primary node. In the event that a main primary node does not detect any packets from the other main primary node, the main primary node determines that the other primary node may have failed and performs a process to establish a network with all of the secondary nodes 850 and 860. The main primary node 802 or 806 attempting to establish a network with all of the secondary nodes 850 and 860 may expand the length of the superframe to include time slots for the uplink allocations of the now larger number of secondary nodes 850, 860. The latency of each node secondary node 850 and 860 transmitting its battery data to the surviving main primary node may increase due to the larger number of secondary nodes accommodated by each superframe, but the WBMS 800 has redundancy to handle a failure of a main primary node.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

Modifications are possible in the described embodiments, and other embodiments are possible, within the scope of the claims.

What is claimed is:

1. A system, comprising:

a first plurality of secondary devices, each secondary device of the first plurality of secondary devices including a first wireless transmitter and a battery monitor integrated circuit (IC), the battery monitor IC configurable to obtain battery data from at least one battery cell, and the first wireless transmitter configurable to wirelessly transmit the battery data;

a shared memory configurable to store network data;

a first primary device having a second wireless transmitter configurable to be wirelessly coupled to the first wireless transmitters of the first plurality of secondary devices via a first wireless network using the network data; and a second primary device including a third wireless transmitter and configurable to:

detect a fault with the first primary device;

retrieve the network data from the shared memory; and establish a second wireless network with the first plurality of secondary devices using the network data and in response to detecting the fault.

2. The system of claim 1, wherein the first primary device is configurable to transmit, to the second primary device, an interrupt signal indicating the fault of the first primary device.

3. The system of claim 1, wherein the shared memory is accessible by the first primary device and the second primary device, wherein the first primary device is configurable to store the network data to the shared memory, and wherein the second primary device is configurable to access the network data in the shared memory to establish the second wireless network.

4. The system of claim 1, wherein the second primary device is configurable to:

periodically monitor transmissions from the first primary device; and detect the fault with the first primary device upon an absence of an expected transmission from the first primary device.

5. The system of claim 1, further comprising a second plurality of secondary devices, wherein the second primary device is configurable to be wirelessly coupled to the second plurality of secondary devices via a third wireless network before detecting the fault with the first primary device, and wherein the second primary device is configurable to establish the second wireless network with the first and second pluralities of secondary devices in response to detecting the fault with the first primary device.

6. The system of claim 5, wherein each secondary device within the first plurality of secondary devices and each secondary device within the second plurality of secondary devices includes a unique identifier, and wherein the second primary device includes the unique identifiers of the secondary devices of the first and second pluralities of secondary devices.

7. The system of claim 5, wherein the second primary device is configurable to allocate an uplink allocation for each secondary device of the first and second pluralities of secondary devices upon establishing the second wireless network.

8. The system of claim 1, wherein the second primary device is configurable to:

scan for a packet from the first primary device; and detect the fault with the first primary device in response to detecting no packets from the first primary device.

9. The system of claim 1, wherein the second primary device is coupled to the first primary device via a line, and wherein the second primary device is configurable to:

receive a signal from the first primary device via the line; and detect the fault with the first primary device based on the received signal.

10. A system, comprising:

a plurality of battery cells;

a first plurality of secondary devices, each secondary device of the first plurality of secondary devices including a first wireless transmitter and a battery monitor integrated circuit (IC), wherein the battery monitor IC is configurable to be coupled to a subset of the plurality of battery cells, wherein the battery monitor IC is configurable to obtain battery data from the respective subset of battery cells, wherein the first wireless transmitter is configurable to wirelessly transmit the battery data, and wherein the battery data includes voltage data or current data;

a second plurality of secondary devices;

a first primary device having a second wireless transmitter wirelessly configurable to be coupled to the first wireless transmitters of the first plurality of secondary devices via a first wireless network; and a second primary device having a third wireless transmitter, wherein the second primary device is configurable to:

detect a fault with the first primary device;

establish a second wireless network with the second plurality of secondary devices before detecting the fault with the first primary device; and establish a third wireless network with the first plurality of secondary devices and the second plurality of secondary devices in response to detecting the fault.

11. The system of claim 10, wherein the first primary device is configurable to transmit an interrupt signal to the second primary device to indicate the fault of the first primary device.

12. The system of claim 10, further comprising a shared memory accessible by the first primary device and the second primary device, wherein the first primary device is configurable to store network data corresponding to the first wireless network in the shared memory, and wherein the second primary device is configurable to access the network data in the shared memory to establish the second wireless network.

13. The system of claim 12, wherein the network data includes timing data of the first wireless network.

14. The system of claim 10, wherein the second primary device is configurable to detect the fault with the first primary device upon an absence of a transmission from the first primary device.

15. The system of claim 10, wherein the second primary device is configurable to:

scan for a packet from the first primary device; and detect the fault with the first primary device in response to detecting no packets from the first primary device.

16. A system comprising:

a shared memory configurable to store network data;

a first primary device coupled to the shared memory and configurable to establish a first network using the network data;

a second primary device coupled to the shared memory and configurable to:

detect a fault with the first primary device;

retrieve the network data from the shared memory; and establish a second network using the network data in response to detecting the fault; and a plurality of secondary devices, wherein each secondary device of the plurality of secondary devices includes:

a battery monitor integrated circuit (IC) configurable to be coupled to a battery cell; and

a wireless transmitter coupled to the battery monitor IC and configurable to:
transmit first data related to the battery cell to the first primary device; and
transmit second data related to the battery cell to the second primary device,
wherein the second primary device is configurable to establish the second network with the plurality of secondary devices using the network data in response to detecting the fault.

17. The system of claim 16, wherein the second primary device is configurable to:
scan for a packet from the first primary device; and
establish the second network with the plurality of secondary devices in response to detecting no packets from the first primary device.

18. The system of claim 16, wherein the first primary device is configurable to transmit an interrupt signal to the second primary device to indicate the fault of the first primary device.

12

19. The system of claim 16,
wherein the shared memory is accessible by the first primary device and the second primary device,
wherein the first primary device is configurable to store the network data in the shared memory, and
wherein the second primary device is configurable to access the network data in the shared memory to establish the second network.

20. The system of claim 16, wherein the second primary device is configurable to:
synchronize to the first primary device by tracking the first network of the first primary device;
determine that the first primary device has failed after synchronizing to the first primary device; and
establish the second network with the plurality of secondary devices in response to determining that the first primary device has failed.

* * * * *